US010181415B2

(12) United States Patent
Cheng et al.

(10) Patent No.: US 10,181,415 B2
(45) Date of Patent: *Jan. 15, 2019

(54) 3D IC BUMP HEIGHT METROLOGY APC

(71) Applicant: Taiwan Semiconductor Manufacturing Co., Ltd., Hsin-Chu (TW)

(72) Inventors: Nai-Han Cheng, Zhudong Township (TW); Chi-Ming Yang, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/831,806

(22) Filed: Dec. 5, 2017

(65) Prior Publication Data

US 2018/0096872 A1 Apr. 5, 2018

Related U.S. Application Data

(63) Continuation of application No. 14/798,661, filed on Jul. 14, 2015, now Pat. No. 9,859,139.

(51) Int. Cl.
*G01B 11/02* (2006.01)
*G01B 11/24* (2006.01)
(Continued)

(52) U.S. Cl.
CPC ........ *H01L 21/67288* (2013.01); *G01B 11/14* (2013.01); *G01B 11/161* (2013.01);
(Continued)

(58) Field of Classification Search
CPC ... G01B 11/14; G01B 11/161; G01B 11/2441; H01L 21/4853; H01L 21/4857;
(Continued)

(56) References Cited

U.S. PATENT DOCUMENTS 5,311,275 A 5/1994 Taniguchi et al.
6,564,166 B1 5/2003 Ume et al.
(Continued)

FOREIGN PATENT DOCUMENTS

CN 1274074 A 11/2000
CN 101244523 A 8/2008
(Continued)

OTHER PUBLICATIONS

Shanmugasundram, et al. "Integrated Metrology and Advanced Process Control in Semiconductor Manufacturing."Feb. 25, 2002. Retrieved from www.electrochem.org/dl/ma/201/pdfs/0619.pdf.
(Continued)

*Primary Examiner* — Tuan N Nguyen
(74) *Attorney, Agent, or Firm* — Eschweiler & Potashnik, LLC

(57) ABSTRACT

In some embodiments, the present disclosure relates to a method of bump metrology The method is performed by forming a through-substrate-via within a substrate, forming a plurality of metal interconnect layers within a dielectric structure over the substrate, and forming a bump on the plurality of metal interconnect layers. One or more substrate warpage parameters of the substrate are measured and an initial position of a lens within a substrate metrology module is calculated based upon the one or more substrate warpage parameters. The lens is then moved to the initial position, and a height and a width of the bump are measured using the substrate metrology module after moving the lens to the initial position.

20 Claims, 8 Drawing Sheets

(51) Int. Cl.

| | |
|---|---|
| *H01L 21/67* | (2006.01) |
| *G01B 11/16* | (2006.01) |
| *G01B 11/14* | (2006.01) |
| *H01L 21/66* | (2006.01) |
| H01L 23/00 | (2006.01) |
| H01L 21/768 | (2006.01) |
| H01L 25/00 | (2006.01) |
| H01L 25/065 | (2006.01) |

(52) U.S. Cl.
CPC .......... *G01B 11/2441* (2013.01); *H01L 22/20* (2013.01); *H01L 21/76898* (2013.01); *H01L 22/12* (2013.01); *H01L 23/562* (2013.01); *H01L 24/11* (2013.01); *H01L 25/0657* (2013.01); *H01L 25/50* (2013.01); *H01L 2224/0401* (2013.01); *H01L 2224/1146* (2013.01); *H01L 2224/131* (2013.01); *H01L 2224/16146* (2013.01); *H01L 2224/16227* (2013.01); *H01L 2224/17181* (2013.01); *H01L 2224/94* (2013.01); *H01L 2225/06513* (2013.01); *H01L 2225/06517* (2013.01); *H01L 2225/06541* (2013.01); *H01L 2924/15311* (2013.01); *H01L 2924/3511* (2013.01)

(58) Field of Classification Search
CPC ....... H01L 23/49894; H01L 2224/1146; H01L 2224/17181; H01L 21/67288; H01L 22/12
USPC .................................................. 438/7; 703/13
See application file for complete search history.

(56) References Cited

U.S. PATENT DOCUMENTS

| | | | |
|---|---|---|---|
| 7,372,555 | B2 | 5/2008 | Watanbe |
| 2005/0241168 | A1 | 11/2005 | Iannuzzelli et al. |
| 2006/0207317 | A1 | 9/2006 | Watanabe |
| 2007/0188859 | A1 | 8/2007 | Tokita |
| 2011/0172982 | A1 | 7/2011 | Veeraraghavan et al. |
| 2013/0171336 | A1* | 7/2013 | Cheng ............... H01L 21/68785 427/9 |
| 2014/0184782 | A1 | 7/2014 | Woo et al. |
| 2015/0253256 | A1* | 9/2015 | Zhou .................. G01N 21/9501 356/237.5 |

FOREIGN PATENT DOCUMENTS

| | | | | |
|---|---|---|---|---|
| CN | 104136881 | A | 11/2014 | |
| JP | H06281269 | A | 10/1994 | |
| JP | 2000310518 | * | 11/2000 | ............. G01B 11/24 |
| JP | 2000310518 | A | 11/2000 | |
| JP | 2002236002 | * | 8/2002 | ............. G01B 11/02 |
| JP | 2002236002 | A | 8/2002 | |
| KR | 20100026651 | A | 3/2010 | |
| WO | 2014052811 | A1 | 4/2014 | |
| WO | WO2014052811 | * | 4/2014 | ............. H01L 21/66 |

OTHER PUBLICATIONS

Prasad, et al. How Does a Confocal Microscope Work? Jun. 1, 2015. Retrieve from http://www.physics.emory.edu/faculty/weeks//confocal/.

Non-Final Office Action dated Nov. 28, 2016 for U.S. Appl. No. 14/798,661.

Final Office Action dated Apr. 4, 2017 for U.S. Appl. No. 14/798,661. Notice of Allowance dated Aug. 21, 2017 for U.S. Appl. No. 14/798,661.

\* cited by examiner

3D IC BUMP HEIGHT METROLOGY APC

REFERENCE TO RELATED APPLICATION

This Application is a Continuation of U.S. application Ser. No. 14/798,661 filed on Jul. 14, 2015, the contents of which are hereby incorporated by reference in their entirety.

BACKGROUND

A multi-dimensional integrated chip is an integrated circuit having multiple substrates or die which are vertically stacked onto and electrically interconnected to one another. By electrically interconnecting the stacked substrates or die, the multi-dimensional integrated chip acts as a single device, which provides improved performance, reduced power consumption, and a reduced footprint over convention integrated chips. Therefore, multi-dimensional integrated chips provide a path to continue to meet the performance/cost demands of next-generation integrated circuits without further lithographic scaling.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
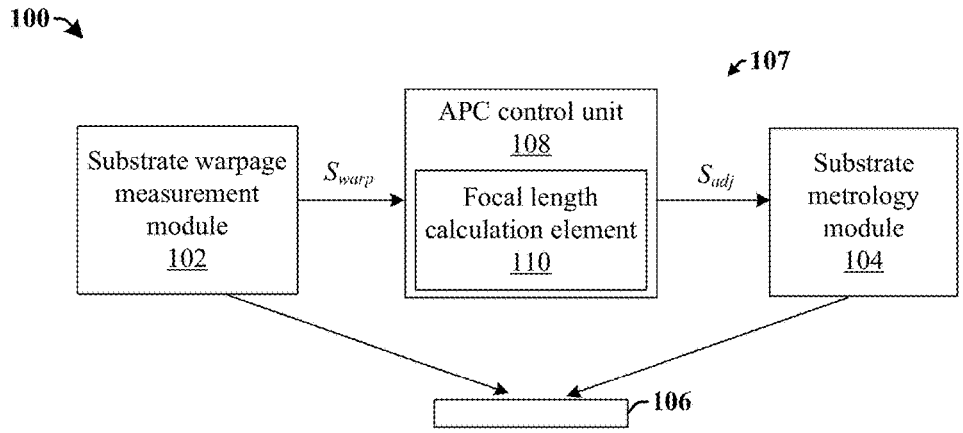
FIG. 1 illustrates a block diagram of some embodiments of semiconductor fabrication system that uses advanced process control (APC) for substrate metrology.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Three-dimensional integrated chips (3DIC) are manufactured by stacking multiple integrated chip die on top of one another. The stacked integrated chip die are electrically interconnected using through-substrate-vias (TSVs), which vertically extend through an integrated chip die to conductive bumps disposed between vertically adjacent integrated chip die. By vertically interconnecting the integrated chip die, the stacked integrated chip die behave as a single integrated chip device. To ensure a good electrical connection between stacked integrated chip die, bump metrology is often performed to characterize the conductive bumps prior to stacking the integrated chip die. For example, if a conductive bump has a height that is too small, or a critical dimension (CD) that is too large, the conductive bump will not form a good electrical contact between TSV of adjacent integrated chip die.

Bump metrology is generally performed using a fixed process-recipe combined with statistical process control that is used to monitor the production process. However, 3DIC typically use integrated chip die having thinned substrates with a relatively large warpage (i.e., the substrates bend from a planar topography since they have a smaller ratio of thickness to diameter). The increasing wafer warpage and decreasing feature sizes complicates the measurement of conductive bumps. For example, the warpage of a substrate may cause a lens used by a bump metrology module to take longer to focus on the substrate. In extreme cases of substrate warpage, the lens may even bump into a warped substrate, leading to physical damage to the substrate.

Accordingly, the present disclosure relates to a method of bump metrology that relies upon advanced Process Control (APC) to provide substrate warpage parameters describing a warpage of a substrate to a bump metrology module to improve focus of the bump metrology module. In some embodiments, the method comprises measuring one or more substrate warpage parameters of a semiconductor substrate. An initial focal height of a lens of a bump metrology module is calculated based upon the measured substrate warpage parameters. The lens of the bump metrology module is then placed at the initial focal height, and height and width of a plurality of bumps on the semiconductor substrate are subsequently measured using the lens. By providing the substrate warpage parameters to the bump metrology module, the bump metrology module can use real-time process control to account for substrate warpage (e.g., to automatically determine an optimal initial focal height for different substrates based on the substrate warpage parameters), thereby improving throughput and yield.

FIG. 1 illustrates a block diagram of some embodiments of semiconductor fabrication system 100 that uses advanced process control (APC) for substrate metrology.

The semiconductor fabrication system 100 comprises a substrate warpage measurement module 102 and a substrate metrology module 104. The substrate warpage measurement module 102 is configured to measure one or more substrate warpage parameters describing a warpage or bending of a semiconductor substrate 106 (i.e., a deviation of the semiconductor substrate 106 from a planar topography). For example, the one or more substrate warpage parameters may comprise height information (e.g., vertical positions) relating to the semiconductor substrate 106 at different positions along the semiconductor substrate 106. The substrate metrology module 104 is configured to measure a height and/or critical dimension of protrusions (e.g., bumps) on the semiconductor substrate 106.

The substrate warpage measurement module 102 and the substrate metrology module 104 are connected by way of a feed-forward path 107. The feed-forward path 107 is configured to provide information relating to the warpage of the semiconductor substrate 106, based upon the one or more substrate warpage parameters, to the substrate metrology module 104. The substrate metrology module 104 is configured to use the information to adjust its operation. In some embodiments, an APC control unit 108 is arranged within the feed-forward path 107. The APC control unit 108 is configured to receive a signal $S_{warp}$ from the substrate warpage measurement module 102 comprising one or more substrate warpage parameters. The APC control unit 108 is configured to generate an adjustment signal $S_{adj}$, based upon the measured substrate warpage parameters, which the substrate metrology module 104 may use to adjust its operation. In some embodiments, the APC control unit 108 may calculate a parameter of the substrate metrology module 104 based upon the one or more substrate warpage parameters, and from the calculated parameter generate the adjustment signal $S_{adj}$.

In some embodiments, the substrate metrology module 104 may comprise one or more lenses and/or mirrors disposed within an optical train configured to measure one or more aspects (e.g., a height, a width, a critical dimension) of a protrusion on the semiconductor substrate 106. In such embodiments, the APC control unit 108 may comprise a focal length calculation element 110. From the substrate warpage parameters, the focal length calculation element 110 is configured to determine an initial focal height. The initial focal height is sent to the substrate metrology module 104, which may adjust a position of one or more lenses and/or mirrors disposed within the optical train. By using information from the substrate warpage measurement module 102 to adjust operation of the substrate metrology module 104, efficiency of the substrate metrology module 104 may be improved, and therefore throughput of the semiconductor fabrication system 100 may be increased.

Figure 2:
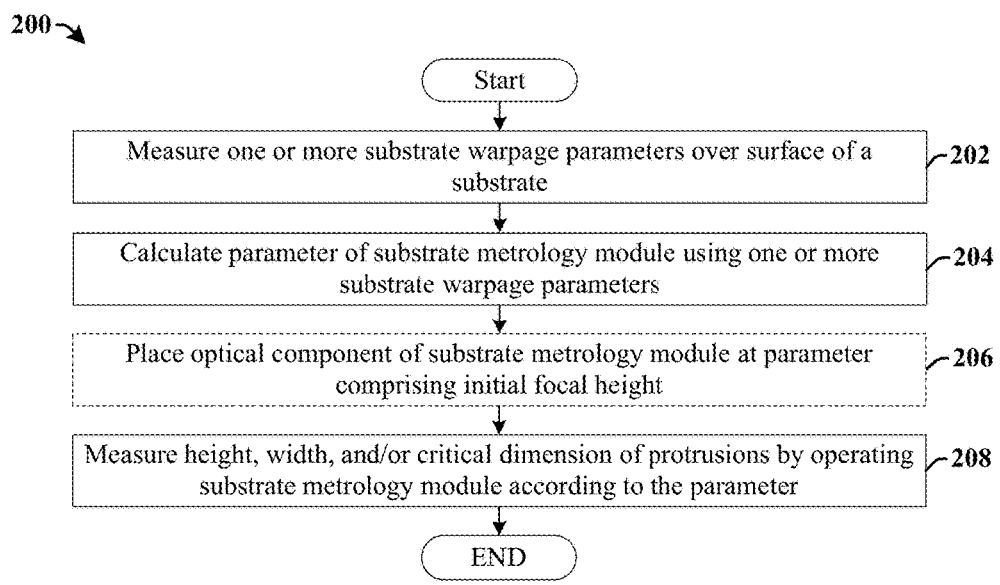
FIG. 2 illustrates a flow diagram of some embodiments of a method of performing substrate metrology using automatic process control.

FIG. 2 illustrates a flow diagram of some embodiments of a method 200 of performing substrate metrology using automatic process control.

While the disclosed methods (e.g., methods 200 and 700) are illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 202, one or more substrate warpage parameters are measured over the surface of a substrate. The one or more substrate warpage parameters may be a position (e.g., a height) of the substrate at different locations along a surface of the substrate. In various embodiments, the one or more substrate warpage parameters may be measured using confocal microscopy or by analyzing a diffraction pattern formed by reflecting particles off of a surface of the substrate.

At 204, a parameter of a substrate metrology module is calculated using the one or more substrate warpage parameters. In some embodiments, the parameter may comprise an initial focal height of an optical component of the substrate metrology module.

At 206, the optical component of the substrate metrology module may be placed at the initial focal height, in some embodiments. In some embodiments, the optical component may comprise an objective lens configured to gather light from the substrate. In other embodiments, the optical component may comprise a mirror. It yet other embodiments, the optical component may comprise a single lens and/or mirror or a combination or multiple lenses and/or mirrors. In some embodiments, the optical component may be an objective lens within a white light interferometer module.

At 208, a height, a width, and/or a critical dimension (CD) of a protrusion (e.g., bump) on the substrate is measured by operating the substrate metrology module according to the parameter. For example, in some embodiments, measuring the height, the width, and/or the critical dimension (CD) of a protrusion may be performed by using the optical component after it has been placed at the initial focal height.

Because the initial height of the optical component of the substrate metrology module is set to a position that is based upon the one or more substrate warpage parameters, the initial position of the optical component can be set to a more accurate position. The more accurate position allows for a measurement of the height, the width, and/or the critical dimension (CD) of protrusions on the substrate to be made in a shorter time period, thereby increasing substrate throughput and also preventing damage to substrate (e.g., due to a lens focusing on a warped substrate).

Figure 3:
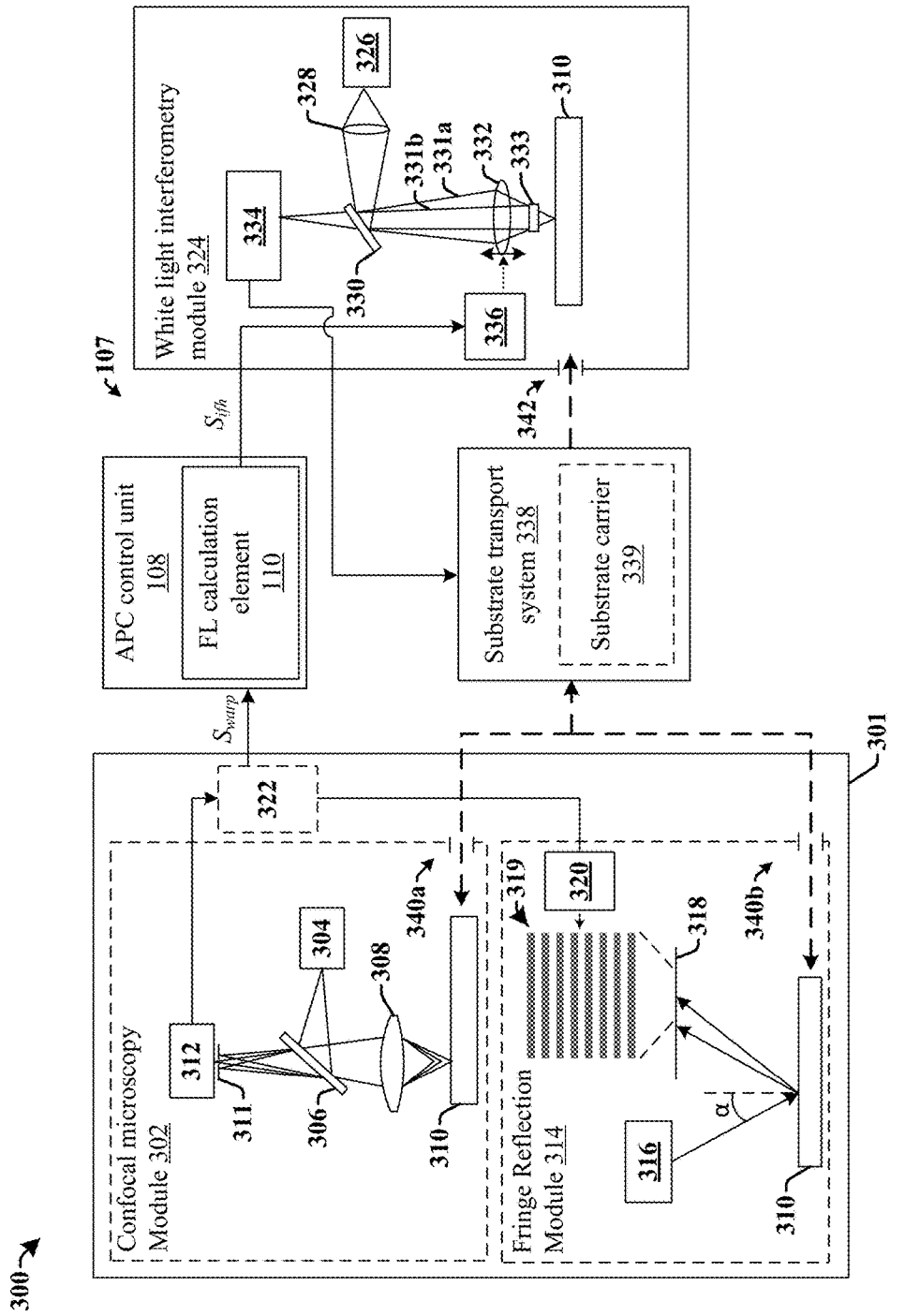
FIG. 3 illustrates a block diagram of some embodiments of substrate metrology system comprising a substrate warpage measurement module and a white light interferometer module.

FIG. 3 illustrates a block diagram of some embodiments of substrate metrology system 300 comprising a substrate warpage measurement module and a white light interferometer module.

The substrate warpage measurement module 301 is configured to measure one or more substrate warpage parameters describing a warpage of a semiconductor substrate 310. In some embodiments, the substrate warpage measurement module 301 comprises a confocal microscopy module 302 configured to measure a warpage of a semiconductor substrate 310 using confocal microscopy. The confocal microscopy module 302 comprises a light source 304 configured to provide light to a beam splitter 306. In some embodiments, the light source 304 may comprise a laser configured to generate coherent light. The beam splitter 306 reflects the light toward an objective lens 308, which focuses the light onto a semiconductor substrate 310. In some embodiments, the objective lens 308 may be configured to move the light over the surface of the semiconductor substrate 310. For example, in some embodiments, one or more mobile mirrors configured to move the position of the light may be arranged upstream of the objective lens 308. In other embodiments, an actuator (not shown) may be configured to move the semiconductor substrate 310 so that the objective lens 308 may scan the light around the semiconductor substrate 310. The light is reflected from the semiconductor substrate 310 back through the beam splitter 306, and is focused on a pinhole aperture 311. Focused light passes through the pinhole aperture 311 and is collected by an imaging device 312 (e.g., a CCD, photomultiplier, etc.). The imaging device 312 is configured to determine the one or more substrate warpage parameters from the focused light.

In some additional embodiments, the substrate warpage measurement module 301 comprises a fringe reflection module 314. The fringe reflection module 314 comprises a particle source 316 configured to project particles toward a surface of the semiconductor substrate 310 at an angle α with respect to the normal of the surface. In some embodiments, the particle source 316 may comprise an electron source configured to generate electrons. The particles reflect off of a surface of the semiconductor substrate 310 and form a diffraction pattern 319 along a diffraction plane 318. A diffraction analysis element 320 is configured to analyze the diffraction pattern 319, and from the diffraction pattern 319 to determine the one or more substrate warpage parameters.

In some embodiments, the substrate warpage measurement module 301 may comprise the confocal microscopy module 302, but not the fringe reflection module 314. In such embodiments, the one or more substrate warpage parameters are determined based upon measurements taken by the confocal microscopy module 302. In other embodiments, the substrate warpage measurement module 301 may comprise the fringe reflection module 314, but not the confocal microscopy module 302. In such embodiments, the one or more substrate warpage parameters are determined based upon measurements taken by the fringe reflection module 314. In yet other embodiments, the substrate warpage measurement module 301 may comprise both the confocal microscopy module 302 and the fringe reflection module 314. In such embodiments, the one or more substrate warpage parameters are determined based upon a combination of measurements taken by the confocal microscopy module 302 and the fringe reflection module 314.

The one or more substrate warpage parameters are provided (as signal $S_{warp}$) to an APC control unit 108 located within a feed-forward path 107. In some embodiments, the imaging device 312 and/or the diffraction analysis element 320 are coupled to one or more computers 322, which are configured to perform processing prior to sending the one or more substrate warpage parameters to the APC control unit 108. The APC control unit 108 comprises a focal length calculation element 110. The focal length calculation element 110 is configured to use the one or more substrate warpage parameters to determine one or more initial objective lens heights.

The one or more initial objective lens heights are provided (as signal $S_{ifh}$) from the APC control unit 108 to a position control element 336 within a white light interferometer module 324 by way of the feed-forward path 107. In some embodiments, the feed-forward path 107 may comprise a conductive wire. In other embodiments, the feed-forward path 107 may comprise a wireless signal path. The white light interferometer module 324 comprises a white light source 326 configured to generate white light (e.g., light having multiple wavelengths spanning the visible spectrum). The white light is collimated from the white light source 326 by collimating element 328. The collimated light is provided to a beam splitter 330 configured to split into an object beam 331a and a reference beam 331b. The object beam 331a is provided to an objective lens 332, which is configured to focus the object beam 331a onto the semiconductor substrate 310. The position control element 336 is configured to change an initial focal height of the objective lens 332 based upon the one or more initial objective lens heights. The reference beam 331b is reflected off of a reflective mirror 333. The reflected light from the object beam 331a and the reference beam 331b are captured and recombined at the beam splitter 330. The superimposed beams are provided to an imaging element 334 (e.g., a CCD camera) for processing. If the optical path of the object beam 331a and the reference beam 331b are the same length, then there is constructive interference and pixel of a respective object point on the semiconductor substrate 310 has a high intensity. If the optical path of the object beam 331a and the reference beam 331b are not the same length, the pixel has a much lower intensity. Consequently, the imaging element 334 output can be processed pixel by pixel to determine the height of bumps on the semiconductor substrate 310.

In some embodiments, the substrate metrology system 300 may further comprise a substrate transport system 338. The substrate transport system 338 is configured to transport the semiconductor substrate 310 between the substrate warpage measurement module 301 and the white light interferometer module 324. In some embodiments, the substrate transport system 338 may be further configured to transport the semiconductor substrate 310 between the confocal microscopy module 302 and the fringe reflection module 314. In some embodiments, the substrate transport system 338 may comprise one or more robotic elements configured to handle the semiconductor substrate 310 during transfer from a port 340 of the confocal microscopy module 302 and/or the fringe reflection module 314 to a port 342 of the white light interferometer module 324 using a wafer carrier 339. In some embodiments, the wafer carrier 339 may comprise a front opening unified pods (FOUPs) containing one or more semiconductor substrates.

In some embodiments, the substrate transport system 338 may be configured to transfer semiconductor substrates having bump heights and/or CD that violate a pre-determined criteria to different locations than semiconductor substrates having bump heights and/or CD that do not violate the pre-determined criteria. For example, if a semiconductor substrate has a measured bump height that is smaller than a pre-determined criteria and/or the measured CD that is larger than a pre-determined criteria, the semiconductor substrate may be discarded or provided to a tool configured to re-perform bump processing to form new conductive bumps.

Figure 4:
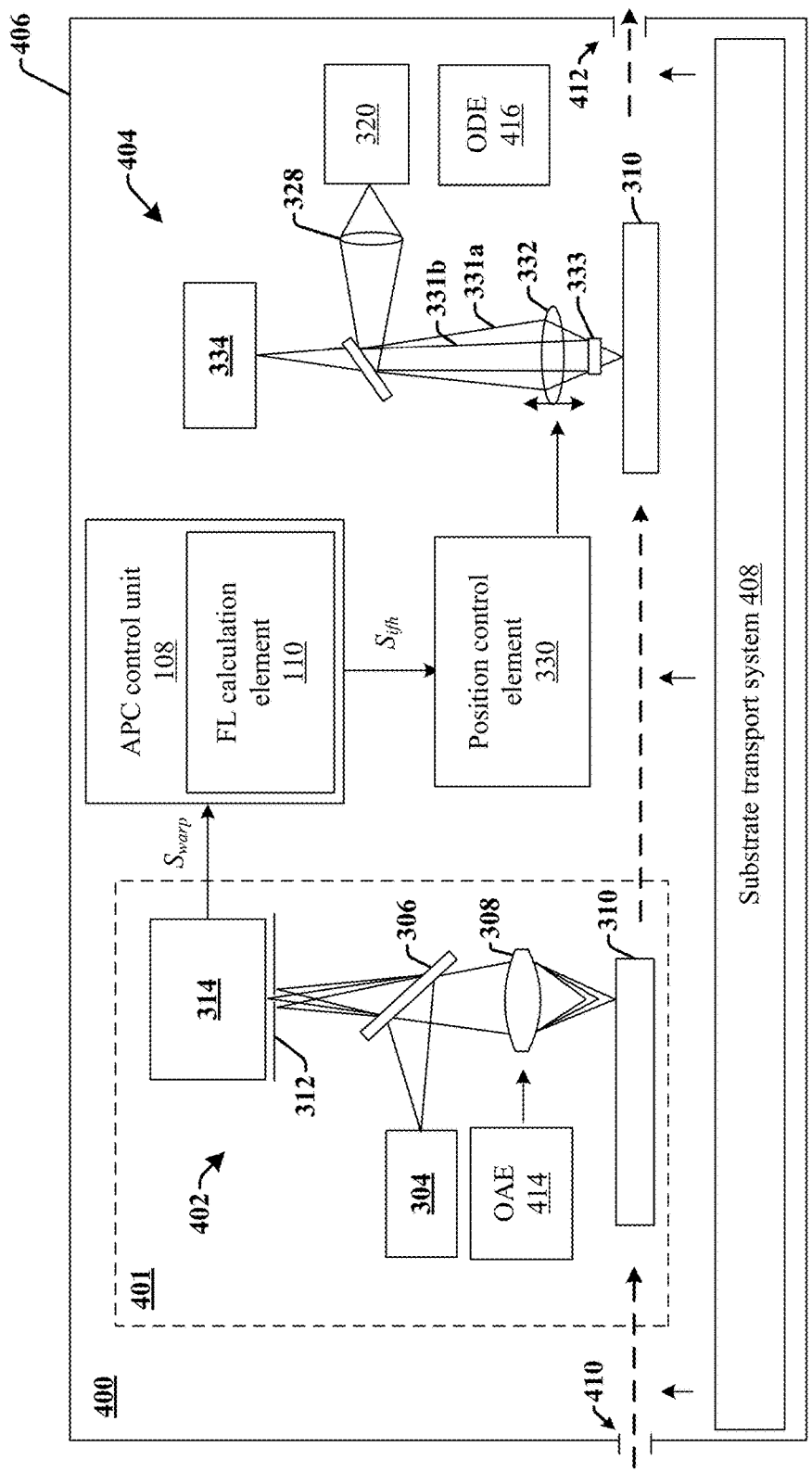
FIG. 4 illustrates a block diagram of some alternative embodiments of substrate metrology system comprising a substrate warpage measurement module and a white light interferometer module.

FIG. 4 illustrates a block diagram of some alternative embodiments of substrate metrology system 400 comprising a substrate warpage measurement module and a white light interferometer module.

The substrate warpage measurement module 401 and the white light interferometer module 404 are arranged within a shared housing 406. In some embodiments, the substrate warpage measurement module 401 may comprise a confocal microscopy module 402. In other embodiments (not shown), the substrate warpage measurement module 401 may comprise a fringe reflection module. The shared housing 406 comprises a rigid casing that encloses and protects the substrate warpage measurement module 401 and the white light interferometer module 404. During operation, a wafer transport system 408 may be configured to transfer a semiconductor substrate 310 from the substrate warpage measurement module 401 to the white light interferometer module 404 within the shared housing 406, thereby preventing exposure of the semiconductor substrate 106 to air-borne particle based defects. The wafer transport system 408 may also be configured to transport the semiconductor substrate 106 from an input port 410 to an output port 412 of the shared housing 406.

The shared housing 406 further comprises an APC control unit 108 located within a feed-forward path arranged within the shared housing. The APC control unit 108 is configured to receive one or more substrate warpage parameters (as signal $S_{warp}$) from the confocal microscopy module 402, to calculate initial focal heights from the one or more substrate warpage parameters, and to provide the initial focal heights (as signal $S_{warp}$) to the white light interferometer module 404, as described above.

In some embodiments, the substrate metrology system 400 may further comprise an orientation detection element 414 and an orientation alignment element 416. The orientation detection element 414 is in communication with the semiconductor substrate 310 when it is located within the substrate warpage measurement module 401. The orientation detection element 414 is configured to determine an orientation of the semiconductor substrate 310. For example, the orientation detection element 414 may determine an orientation of the semiconductor substrate 310 relative to a notch in the semiconductor substrate 310. The orientation alignment element 416 is in communication with the semiconductor substrate 310 when it is located within the white light interferometer module 404. The orientation alignment element 416 is configured to determine an alignment of the semiconductor substrate 310 so that the one or more substrate warpage parameters can be applied to the substrate within the white light interferometer module 404.

Figure 5:
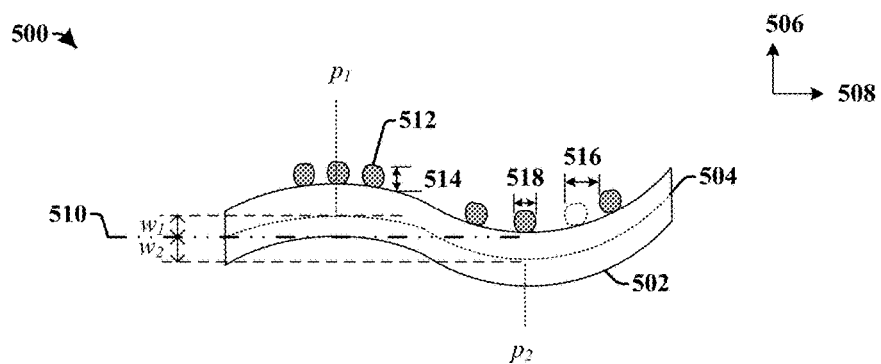
FIG. 5 illustrates some embodiments of a cross-sectional view of a warped substrate illustrating examples of one or more substrate warpage parameters and bump metrology parameters.

FIG. 5 illustrates some embodiments of a cross-sectional view 500 of a warped substrate 502 illustrating an example of one or more substrate warpage parameters and bump metrology parameters. It will be appreciated that the example of the one or more substrate warpage parameters is a non-limiting example and that in alternative embodiments, different substrate warpage parameters may be used.

The warped substrate 502 has a curved median surface 504 that has a height or vertical position (along direction 506) that varies as a function of lateral position (along direction 508). A median surface reference plane 510 extends along a median point of the curved median surface 504 (i.e., through a median height of the warped substrate 502). The one or more substrate warpage parameters of the warped substrate 502 are the deviation of the curved median surface 504 from the median surface reference plane 510. For example, at a first lateral position $p_1$, the warped substrate 502 has a first substrate warpage parameter with a value of $w_1$. At a second lateral position $p_2$, the warped substrate 502 has a second substrate warpage parameter with a value of $w_2$.

One or more conductive bumps 512 are located on an upper surface of the warped substrate 502. The one or more conductive bumps 512 may comprise solder bumps or micro-bumps used for interconnecting substrates in a multi-dimensional integrated chip. The one or more conductive bumps 512 have a height 514, a critical dimension (CD) 516, and a width 518. The height 514 is a distance that a conductive bump extends outward from the upper surface of the warped substrate 502. The CD 516 is the variation between an expected position of an edge of a conductive bump and an actual position of an edge of the conductive bump. The CD 516 may be affected by photolithography overlay errors, sizing errors, or the like. The height 514 and the CD 516 of the one or more conductive bumps 512 may impact the subsequent electrical connection formed by the one or more conductive bumps 512.

Figure 6:
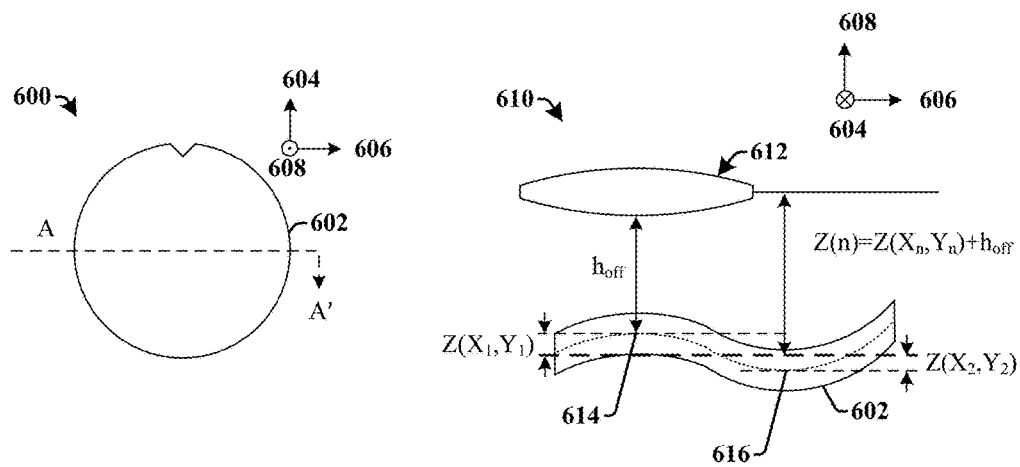
FIG. 6 illustrates some embodiments of views showing calculation of an initial focal height from one or more substrate warpage parameters.

FIG. 6 illustrates some embodiments of views, 600 and 610, showing calculation of an initial focal height from one or more substrate warpage parameters. It will be appreciated that the example of the calculation is a non-limiting example and that in alternative embodiments, different method of calculating the initial focal height may be used.

Top-view 600 illustrates a semiconductor substrate 602. Cross-sectional view 610 illustrates a cross-sectional view of the semiconductor substrate 602 along cross-sectional line A-A' of top-view 600. As shown in cross-sectional view 610, the semiconductor substrate 602 is warped along a curved median surface having a height that varies in direction 608, as a function of position along direction 606 and along direction 604 (not shown). The initial focal height Z(n) of an objective lens 612 is found for n points along the surface of the semiconductor substrate 602 by adding an offset value $h_{off}$ to a warpage measurement parameter $Z(X_n, Y_n)$ measured at the points (i.e., $Z(n)=Z(X_n,Y_n)+h_{off}$). For example, at a first point 614 the initial focus height Z(1) may be equal to a substrate warpage parameter $Z(X_1,Y_1)$ of the semiconductor substrate 602 at the first point 614 plus the offset value $h_{off}$. At a second point 616 the initial focus height Z(2) may be equal to a substrate warpage parameter $Z(X_2,Y_2)$ of the semiconductor substrate 602 at the second point 616 plus the offset value $h_{off}$. In some embodiments, the offset value $h_{off}$ may have a value that is in a range of between approximately 0.1 mm and approximately 1 mm. For example, the offset value $h_{off}$ may have a value of 0.2 mm. In other embodiments, the offset value $h_{off}$ may have a larger or smaller initial value.

Although cross-sectional view 610 illustrates the initial focus height Z(n) relative to certain reference points, it will be appreciated that the illustrated reference points are not limiting. For example, although the initial focus height Z(n) is illustrated as being a distance between the a center of the objective lens and a median surface reference plane 510, the initial focus height Z(n) may be measured between different points (e.g., between a top or bottom surface of the semiconductor substrate 602 and a top or bottom the objective lens 612).

Figure 7:
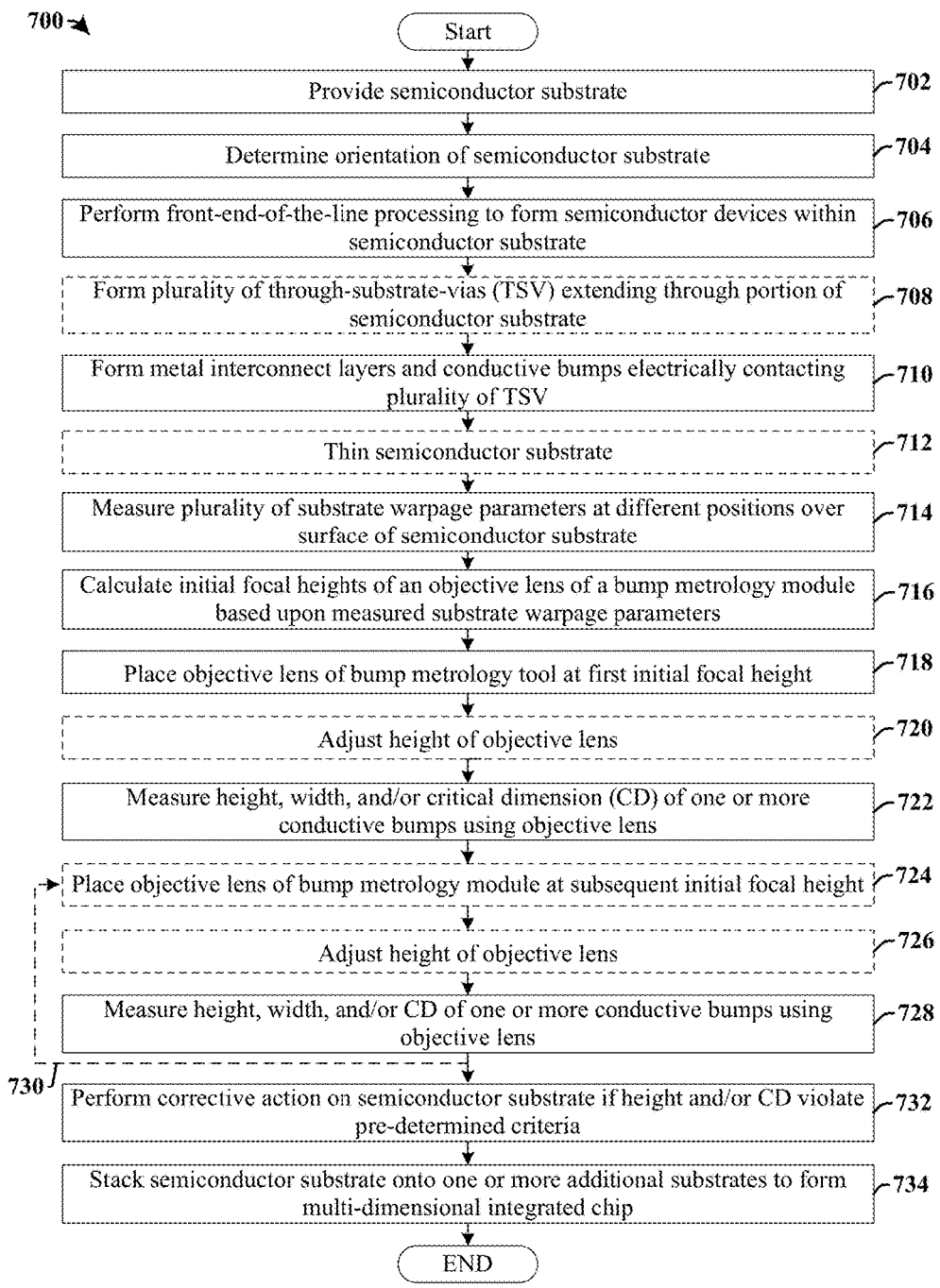
FIG. 7 illustrates a flow diagram of some embodiments of a method of performing bump metrology using advanced process control (APC).

FIG. 7 illustrates a flow diagram of some embodiments of a method 700 of performing bump metrology using advanced process control (APC). Although the method is applied to performing bump metrology for 3DIC, it will be appreciated that the method is not limited to such applications but rather may broadly be used for different applications of bump metrology.

At 702, a semiconductor substrate is provided.

At 704, an orientation of the semiconductor substrate is determined. The orientation of the semiconductor substrate provides a common frame of reference for subsequent measurements (e.g., so that a bump metrology measurement can be made using information from a substrate warpage measurement).

At 706, front-end-of-the-line (FEOL) processing is performed to form a plurality of semiconductor devices within the semiconductor substrate. In various embodiments, the plurality of semiconductor devices may comprise transistors, capacitors, resistors, inductors, etc.

At 708, a plurality of through-substrate-vias (TSV) are formed to extend through a portion of the semiconductor substrate.

At 710, a metal interconnect layers and a plurality of conductive bumps are formed onto the semiconductor substrate in electrical contact with the plurality of TSV.

At 712, the semiconductor substrate is thinned. Thinning the semiconductor substrate reduces a thickness of the semiconductor substrate. In some embodiments, a thickness of the semiconductor substrate is from about 50 to 200 um. In other embodiments, a thickness of the semiconductor substrate is from about 200 to 300 um. In yet other embodiments, a thickness of the semiconductor substrate is from about 300 to 400 um. In some embodiments, the semiconductor substrate may be supported by a carrier wafer.

At 714, a plurality of substrate warpage parameters are measured at different positions over a surface of the semiconductor substrate.

At 716, a plurality of initial focal heights an objective lens of a bump metrology module are calculated using the plurality of substrate warpage parameters.

At 718, an objective lens of the bump metrology module is placed at a first initial focal height. In some embodiments, the objective lens of may be of a white light interferometer.

At 720, the objective lens height may be adjusted. Adjustment of the objective lens height provides for fine tuning of the objective lens position from the initial focal height.

At 722, a height, a width, and/or critical dimension (CD) of a one or more of the conductive bumps is measured using the objective lens.

At 724, an objective lens of a bump metrology module is placed at a subsequent initial focal height. The objective lens is moved to a subsequent initial focal height to measure the height and/or CD of bumps at another point along a surface of the semiconductor substrate (e.g., another point having a different warpage parameter).

At 726, the objective lens height may be adjusted.

At 728, a height and/or critical dimension (CD) of a one or more of the conductive bumps is measured using the objective lens. The measurement process of acts 724-728 may be iteratively performed (as shown by line 730) on a plurality of points located at different spatial position over the surface of the semiconductor substrate using different ones of the plurality of initial focal heights.

At 732, a corrective action is performed on the semiconductor substrate if the height and/or the CD violate a pre-determined criteria. For example, if the measured bump height is smaller than a pre-determined criteria and/or the measured CD is larger than a pre-determined criteria. In some embodiments, the corrective action may comprise discarding the semiconductor substrate. In other embodiments, the semiconductor substrate may comprise provided re-performing bump processing to form new conductive bumps.

At 734, the semiconductor substrate is stacked onto one or more additional substrates to form multi-dimensional integrated chip. In various embodiments, the multi-dimensional integrated chip may comprise a monolithic 3-dimensional (3D) integrated chip, a 2.5-dimensional integrated chip (2.5DIC) comprising a plurality of integrated chip die stacked on an interposer substrate, or a 3D integrated chip comprising a plurality of integrated chip die vertically stacked on top of one another.

FIGS. 8-14 illustrate some embodiments of cross-sectional views of a substrate showing a method of performing bump metrology using advanced process control (APC). Although FIGS. 8-14 are described in relation to method 700, it will be appreciated that the structures disclosed in FIGS. 8-14 are not limited to such a method, but instead may stand alone as structures independent of the method.

Figure 8:
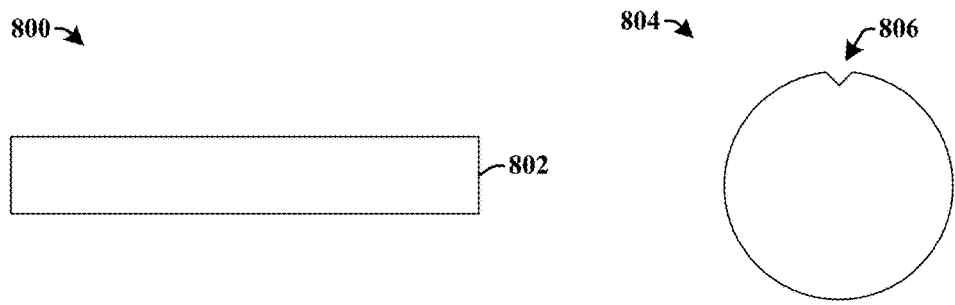
FIGS. 8-14 illustrate some embodiments of cross-sectional views of a substrate showing a method of performing bump metrology using advanced process control (APC).

FIG. 8 illustrates some embodiments of a cross-sectional view 800 of an integrated chip corresponding to acts 702-704.

As shown in cross-sectional view 800, a semiconductor substrate 802 is provided. The semiconductor substrate 802 may be any type of semiconductor body (e.g., silicon, SiGe, SOI) such as a semiconductor wafer and/or one or more die on a wafer, as well as any other type of metal layer, device, semiconductor and/or epitaxial layers, etc., associated therewith.

As shown in top-view 804, an orientation of the semiconductor substrate 802 may be determined. The orientation of the semiconductor substrate 802 may be determined relative to a notch 806 in the semiconductor substrate 802. Determining the orientation of the semiconductor substrate 802 allows for measurements of a substrate warpage to be applied to a subsequent bump metrology measurement.

Figure 9:
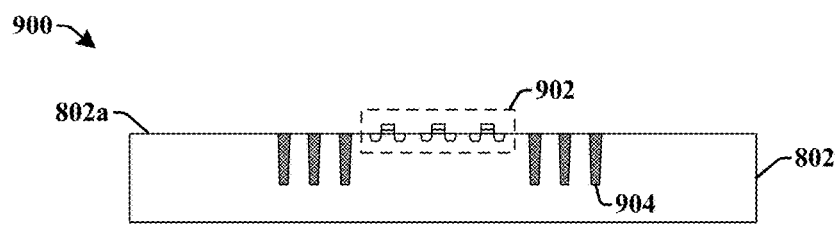

FIG. 9 illustrates some embodiments of a cross-sectional view 900 of an integrated chip corresponding to acts 706-708.

As shown in cross-sectional view 900, the semiconductor substrate 802 is processed to form a plurality of semiconductor devices 902 within a front-side 802*a* of the semiconductor substrate 802. The plurality of semiconductor devices 902 may comprise a transistor device and/or a passive device (e.g., a capacitor, a resistor, an inductor, etc.). The plurality of semiconductor devices 902 may be formed by selective implantation and/or deposition processes.

A plurality of through-substrate-vias (TSV) 904 are formed to extend through a portion of the semiconductor substrate 802. The plurality of TSV 904 are formed by etching trenches within the front-side 802*a* of the semiconductor substrate 802. A liner dielectric layer (not shown) may be formed onto sidewalls of the trenches and a conductive material is formed within the trench to form the plurality of TSV 904. In some embodiments, the conductive material may comprise a metal such as copper or aluminum, for example. In other embodiments, the conductive material may comprise doped polysilicon, for example. The conductive material may be deposited by way of a vapor deposition process (e.g., chemical vapor deposition, physical vapor deposition, etc.) and/or by way of a plating process (e.g., electro-plating or electro-less plating).

Figure 10:
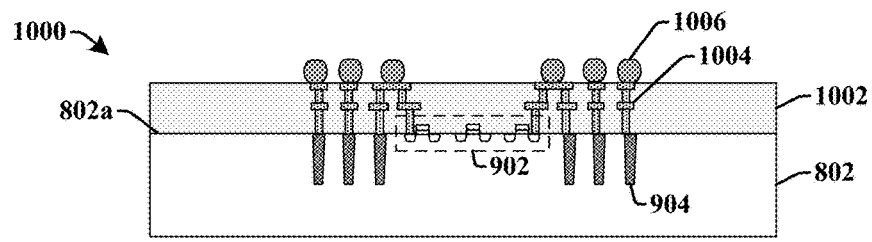

FIG. 10 illustrates some embodiments of a cross-sectional view 1000 of an integrated chip corresponding to act 710.

As shown in cross-sectional view 1000, one or more metal interconnect layers 1004 are formed within one or more inter-level dielectric (ILD) layers 1002 overlying the front-side 802*a* of the semiconductor substrate 802. The one or more metal interconnect layers 1004 (e.g., metal wires and/or vias) comprise a metal material configured to electrically connect the plurality of semiconductor devices 902 to one another and to an external environment. In some embodiments, the one or more metal interconnect layers 1004 may comprise a conductive material such as copper, aluminum, tungsten, etc. In some embodiments, the one or more ILD layers 1002 may comprise a low-k dielectric layer, an ultra low-k dielectric layer, an extreme low-k dielectric layer, and/or a silicon dioxide layer. The one or more metal interconnect layers 1004 vertically extend between the plurality of TSV 904 and one or more conductive bumps 1006 formed onto an upper surface of the one or more ILD layers 1002. The one or more conductive bumps 1006 may comprise solder bumps (e.g., C4 bumps) formed by way of a plating process (e.g., an electroplating process or an electro-less plating process).

Figure 11:
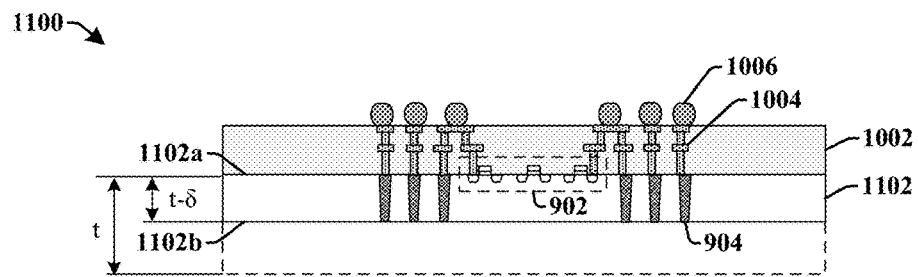

FIG. 11 illustrates some embodiments of a cross-sectional view 1100 of an integrated chip corresponding to act 712.

As shown in cross-sectional view 1100, the semiconductor substrate 802 is thinned to reduce a thickness of the semiconductor substrate 1102 (e.g., from a thickness t to a thickness t–δ). The semiconductor substrate 1102 may be thinned by way of an etching process and/or by physical grinding process. In some embodiments, a thickness of the semiconductor substrate 1102 may be reduced by over 90%. For example, the semiconductor substrate 1102 may have a thickness reduced from a first thickness t in a range of between approximately 700 and approximately 1000 um to a second thickness t–δ less than approximately 50 um. Thinning the semiconductor substrate 1102 exposes the plurality of TSV 904 along a back-side 1102b of the semiconductor substrate 1102, thereby allowing for the plurality of TSV 904 to vertically extend from the front-side 1102a of the semiconductor substrate 1102 to the back-side 1102b of the semiconductor substrate 1102.

Figure 12:
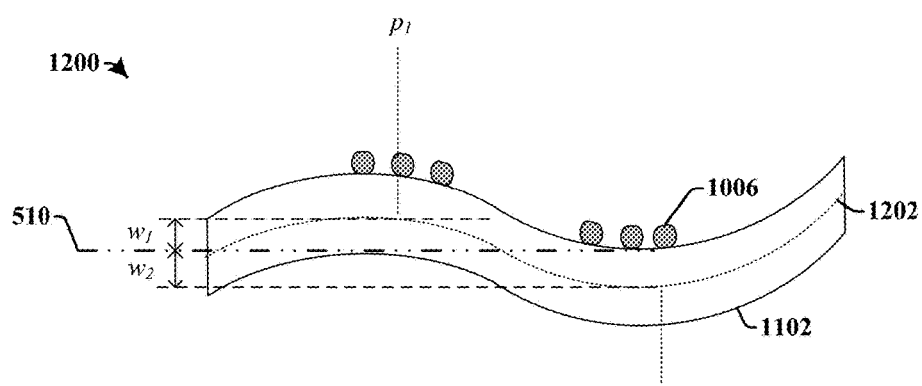

FIG. 12 illustrates some embodiments of a cross-sectional view 1200 of an integrated chip corresponding to act 714. It will be appreciated that the cross-sectional view 1200 omits illustration of the metal interconnect layers 1004 and semiconductor devices 902, for simplification of the cross-sectional view 1200.

As shown in cross-sectional view 1200, one or more substrate warpage parameters $w_1$-$w_2$ of the semiconductor substrate 1102 are measured. The one or more substrate warpage parameters $w_1$-$w_2$ of the semiconductor substrate 1102 are measured over a plurality of distinct points $p_1$-$p_2$ on the semiconductor substrate 1102. For example, the one or more substrate warpage parameters $w_1$-$w_2$ may comprise a height/vertical position of the semiconductor substrate measured at a resolution of N×N pixels (e.g., 512×512, 1024×1024, etc.) over the surface of the semiconductor substrate 1102. In some embodiments, the one or more substrate warpage parameters $w_1$-$w_2$ may comprise a value of a median height/vertical position the substrate at a selected point. In such embodiments, the one or more substrate warpage parameters $w_1$-$w_2$ of the semiconductor substrate 1102 collectively define a curved median surface 1202. In some embodiments, the one or more substrate warpage parameters $w_1$-$w_2$ may comprise a median or an average of height/vertical position values for multiple pixels. In other embodiments, the one or more substrate warpage parameters $w_1$-$w_2$ may comprise a height/vertical position values from a single pixel.

Figure 13:
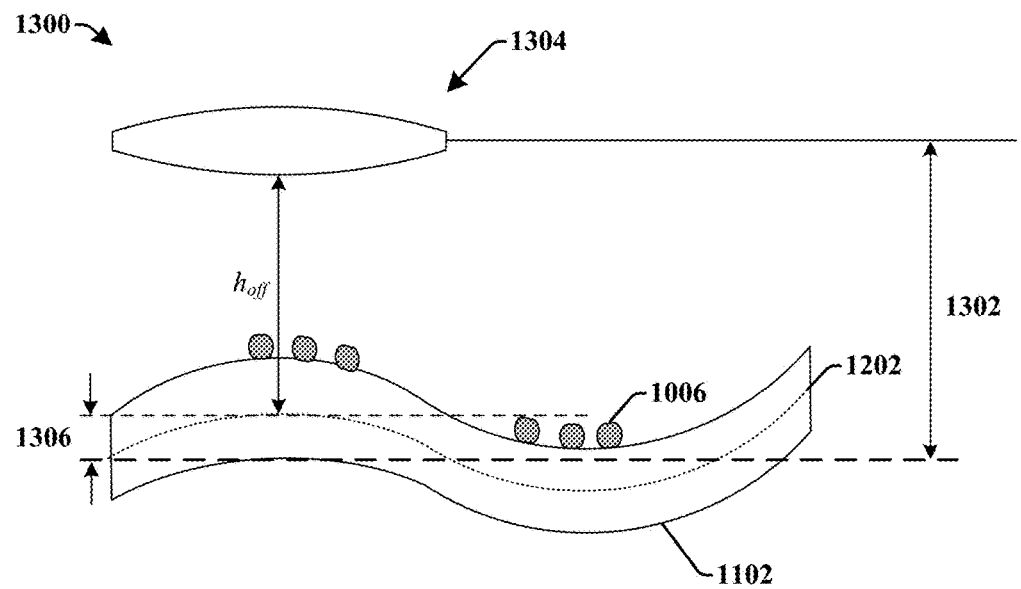

FIG. 13 illustrates some embodiments of a cross-sectional view 1300 of an integrated chip corresponding to acts 716-718. It will be appreciated that the cross-sectional view 1300 omits the metal wire layers and semiconductor devices, for simplification of the cross-section.

As shown in cross-sectional view 1300, an initial height 1302 of an objective lens 1304 of a bump metrology module used to measure a height, a width, and/or critical dimension of the conductive bumps 1006 is set based upon the one or more substrate warpage parameters (e.g., upon the curved median surface 1202). In some embodiments, the initial height 1302 may be equal to a pre-determined offset value $h_{off}$ added to the one or more substrate warpage parameters 1306.

Figure 14:
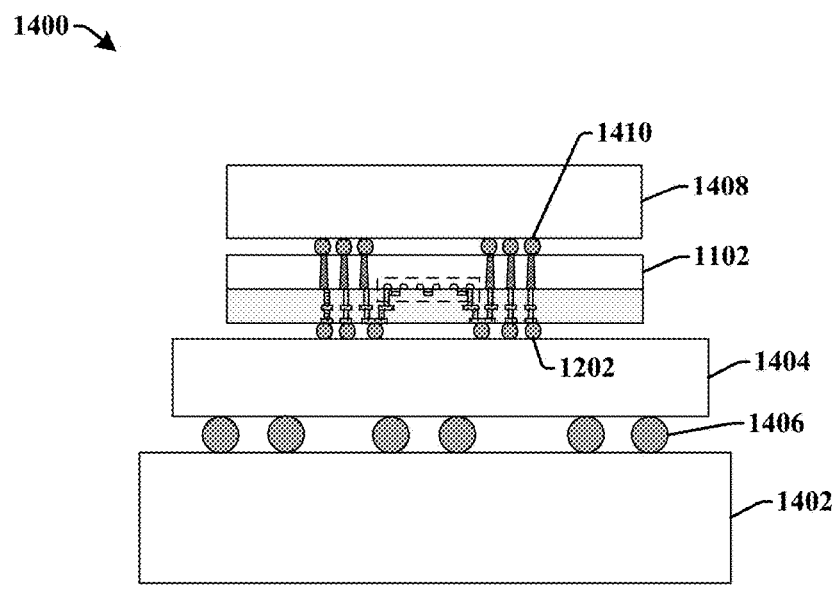

FIG. 14 illustrates some embodiments of a cross-sectional view 1400 of an integrated chip corresponding to act 734.

As shown in cross-sectional view 1400, the semiconductor substrate 1102 is stacked over a package substrate 1402 (or a printed circuit board) to form a multi-dimensional integrated chip. In some embodiments, one or more interposer substrates 1404 may be vertically stacked between the package substrate 1402 and the semiconductor substrate 1102. The interposer substrate 1404 may be coupled to the package substrate 1402 by way of a plurality of solder balls 1406 (e.g., C4 connections). The semiconductor substrate 1102 may be coupled to an additional semiconductor substrate 1408 by way of one or more conductive micro-bumps 1410.

Therefore, the present disclosure relates to a method of bump metrology that relies upon advanced Process Control (APC) to provide substrate warpage parameters describing a warpage of a substrate to a bump metrology module to improve focus of the bump metrology module.

In some embodiments, the present disclosure relates to a method of performing substrate metrology. The method comprises measuring one or more substrate warpage parameters of a semiconductor substrate. The method further comprises calculating a parameter of a substrate metrology module based upon the one or more substrate warpage parameters. The method further comprises measuring a height and a width of a bump on the semiconductor substrate by operating the substrate metrology module according to the parameter.

In other embodiments, the present disclosure relates to a method of performing bump metrology. The method comprises measuring a plurality of positions of a semiconductor substrate at a plurality of different positions over a surface of the semiconductor substrate. The method further comprises calculating a plurality of initial focal heights of an objective lens of a bump metrology module by adding a pre-determined offset to the plurality of positions. The method further comprises placing the objective lens of the bump metrology module at one of the plurality of initial focal heights. The method further comprises measuring a height and a critical dimension of one or more conductive bumps on the semiconductor substrate at a position corresponding to the one of the plurality of initial focal heights using the bump metrology module In yet other embodiments, the present disclosure relates to a substrate metrology system. The system comprises a substrate warpage measurement module configured to measure one or more substrate warpage parameters of a semiconductor substrate. The system further comprises a bump metrology module comprising an optical train configured to measure a height and a critical dimension of a conductive bump on the semiconductor substrate. The system further comprises a feed-forward path extending from the substrate warpage measurement module to the bump metrology module. The system further comprises an advanced process control (APC) element disposed within the feed-forward path and configured to configured to calculate an initial focal height of an objective lens within the optical train.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of performing substrate metrology, comprising:
   forming a through-substrate-via within a substrate;
   forming a plurality of metal interconnect layers within a dielectric structure over the substrate;
   forming a bump on the plurality of metal interconnect layers;
   taking a plurality of separate measurements at a plurality of different positions over a surface of the substrate;
   determining one or more substrate warpage parameters of the substrate from the plurality of separate measurements;
   calculating an initial position of a lens within a substrate metrology module based upon the one or more substrate warpage parameters;
   moving the lens to the initial position;
   measuring a height and a width of the bump using the substrate metrology module after moving the lens to the initial position; and
   bringing the substrate into contact with an additional substrate, wherein the bump comprises a micro-bump arranged between the substrate and the additional substrate.

2. The method of claim 1, wherein the substrate warpage parameters are measured using confocal microscopy.

3. The method of claim 1, further comprising:
   adjusting a position of the lens prior to measuring the height and the width of the bump and after the lens is moved to the initial position.

4. The method of claim 1, further comprising:
   operating a first detector of a warpage measurement module to measure the one or more substrate warpage parameters; and
   operating a second detector of the substrate metrology module to measure the height and the width of the bump, wherein the substrate metrology module is physically downstream of the warpage measurement module.

5. The method of claim 4, further comprising:
   moving the substrate from a first position in the warpage measurement module to a second position within the substrate metrology module; and
   wherein the substrate within the first position is completely separated from the substrate in the second position by a non-zero distance.

6. The method of claim 4, further comprising:
   determining a first orientation of the substrate when it is located within the warpage measurement module; and
   determining a second orientation of the substrate when it is located within the substrate metrology module.

7. The method of claim 1, wherein the one or more substrate warpage parameters comprise height information relating to the substrate at different lateral positions along the substrate.

8. A method of performing substrate metrology, comprising:
   forming a plurality of conductive interconnect layers within a dielectric structure over a substrate;
   forming a bump on the plurality of conductive interconnect layers and over the dielectric structure;
   taking a plurality of separate measurements at a plurality of different positions over a surface of the substrate;
   determining one or more substrate warpage parameters of the substrate from the plurality of separate measurements using a warpage measurement module;
   determining an initial height of a lens within a substrate metrology module using the one or more substrate warpage parameters;
   moving the lens to the initial height;
   moving the substrate from the warpage measurement module to the substrate metrology module; and
   measuring one or more dimensions of the bump using the substrate metrology module after moving the lens to the initial height; and
   bringing the substrate into contact with an additional substrate, wherein the bump comprises a micro-bump arranged between the substrate and the additional substrate.

9. The method of claim 8, wherein the bump is formed on the plurality of conductive interconnect layers prior to measuring the one or more substrate warpage parameters.

10. The method of claim 8, wherein the substrate metrology module has a first detector element and the warpage measurement module has a second detector element that is separate and distinct from the first detector element.

11. The method of claim 8, further comprising:
    measuring the one or more substrate warpage parameters when the substrate is in a first position within the warpage measurement module;
    moving the substrate from the first position to a second position within the substrate metrology module, wherein the substrate in the first position does not overlap the substrate in the second position; and
    measuring the one or more dimensions of the bump when the substrate is in the second position.

12. A substrate metrology system, comprising:
    a substrate warpage measurement module configured to take a plurality of separate measurements at a plurality of different positions over a substrate and to determine one or more substrate warpage parameters of the substrate, wherein the substrate comprises a plurality of conductive interconnect layers within a dielectric structure over the substrate and a bump on the plurality of conductive interconnect layers and over the dielectric structure;
    a bump metrology module comprising a lens and a first detector element, wherein the bump metrology module is configured to measure one or more dimensions of a conductive bump on the plurality of conductive interconnect layers and over the dielectric structure, wherein the conductive bump comprises a micro-bump configured to be coupled to an additional substrate of a multi-dimensional chip;
    an advanced process control (APC) element configured to receive the one or more substrate warpage parameters from the bump metrology module and to calculate an initial height of the lens based upon the one or more substrate warpage parameters; and
    a position control element configured to receive the initial height from the APC element and to move the lens to the initial height.

13. The substrate metrology system of claim 12, wherein the substrate warpage measurement module has a second detector element configured to measure the one or more substrate warpage parameters; and
    wherein the first detector element is separate and distinct from the second detector element.

14. The substrate metrology system of claim 12, wherein the substrate warpage measurement module has a second detector element configured to measure the one or more substrate warpage parameters; and wherein the first detector element does not share any elements with the second detector element.

15. The substrate metrology system of claim 12, further comprising:
an orientation detection element configured to determine a first orientation of the substrate within the substrate warpage measurement module; and
an orientation alignment element configured to determine a second orientation of the substrate within the bump metrology module, wherein the orientation detection element is separate and distinct from the orientation alignment element.

16. The substrate metrology system of claim 12, further comprising:
a substrate transport system configured to transport the substrate between a first position within the substrate warpage measurement module and a second position within the bump metrology module, wherein the first position does not overlap the second position.

17. The substrate metrology system of claim 16, wherein the substrate transport system is configured to transfer the substrate to a first location if the one or more dimensions of the conductive bump violate a pre-determined criteria and to transfer the substrate to a different, second location if the one or more dimensions of the conductive bump do not violate the pre-determined criteria.

18. The substrate metrology system of claim 12, wherein the bump metrology module comprises a white light interferometer.

19. The substrate metrology system of claim 12, wherein the initial height of the lens is provided from the APC element to the position control element by way of a feed-forward path comprising a conductive wire.

20. The substrate metrology system of claim 12, wherein the substrate warpage measurement module comprises a fringe reflection module having a particle source configured to project particles toward a surface of the substrate at a non-zero angle measured with respect to a line that is normal to the surface of the substrate.

* * * * *